(12) United States Patent
Heggemann et al.

(10) Patent No.: US 11,239,440 B2
(45) Date of Patent: Feb. 1, 2022

(54) ELECTRONIC SEMICONDUCTING DEVICE AND METHOD FOR PREPARING THE ELECTRONIC SEMICONDUCTING DEVICE

(71) Applicant: Novaled GmbH, Dresden (DE)

(72) Inventors: Ulrich Heggemann, Dresden (DE); Markus Hummert, Dresden (DE); Thomas Rosenow, Dresden (DE); Mauro Furno, Dresden (DE)

(*) Notice: Subject to any disclaimer, the term of this patent is extended or adjusted under 35 U.S.C. 154(b) by 45 days.

(21) Appl. No.: 16/485,808

(22) PCT Filed: Feb. 20, 2018

(86) PCT No.: PCT/EP2018/054154
§ 371 (c)(1),
(2) Date: Aug. 14, 2019

(87) PCT Pub. No.: WO2018/150048
PCT Pub. Date: Aug. 23, 2018

(65) Prior Publication Data
US 2020/0052209 A1    Feb. 13, 2020

(30) Foreign Application Priority Data

Feb. 20, 2017    (EP) ..................................... 17156902
Feb. 20, 2017    (EP) ..................................... 17156904
Feb. 20, 2017    (EP) ..................................... 17156906

(51) Int. Cl.
*H01L 51/50* (2006.01)
*C07F 3/02* (2006.01)
(Continued)

(52) U.S. Cl.
CPC .............. *H01L 51/506* (2013.01); *C07F 3/02* (2013.01); *C07F 3/06* (2013.01); *C07F 5/022* (2013.01);
(Continued)

(58) Field of Classification Search
CPC . H01L 51/506; H01L 51/0084; H01L 51/008; C09K 11/06; C07F 5/022
See application file for complete search history.

(56) References Cited

U.S. PATENT DOCUMENTS 5,247,226 A    9/1993   Sato et al.
7,288,331 B2   10/2007  Thompson et al.
(Continued)

FOREIGN PATENT DOCUMENTS

CN    109494262 A    3/2019
EP      0510541 A2   4/1992
(Continued)

OTHER PUBLICATIONS

PCT International Search Report and Written Opinion for PCT Application No. PCT/EP2018/054160 dated May 29, 2018 (14 pages).
(Continued)

*Primary Examiner* — Anthony Ho
(74) *Attorney, Agent, or Firm* — Eversheds-Sutherland (US) LLP

(57) ABSTRACT

The present invention relates to an electronic device comprising between a first electrode and a second electrode at least one first hole transport layer, wherein the first hole transport layer comprises (i) at least one first hole transport matrix compound consisting of covalently bound atoms and (ii) at least one electrical p-dopant selected from metal sate and from electrically neutral metal complexes comprising a metal cation and a at least one anion and/or at least one anionic ligand consisting of at least 4 covalently bound atoms, wherein the metal cation of the electrical p-dopant is selected from alkali metals; alkaline earth metals, Pb, Me, Fe, Co, Ni, Zn, Cd; rare earth metals in oxidation state (II)
(Continued)

or (III); Al, Ga, In; and from Sn, Ti, Zr, Hf, V, Nb, Ta, Cr, Mo and W in oxidation state (TV) or less; provided that a) p-dopants comprising anion or anionic ligand having generic formula (Ia) or (Ib) wherein $A^1$, $A^2$, $A^3$ and $A^4$ are independently selected from CO, $SO_2$ or $POR^1$; $R^1$=electron withdrawing group selected from the group comprising halide, nitrile, halogenated or perhalogenated $C_1$ to $C_{20}$ alkyl, halogenated or perhalogenated $C_6$ to $C_{20}$ aryl, or halogenated or perhalogenated heteroaryl with 5 to 20 ring-forming atoms; $B^1$, $B^2$, $B^3$ and $B^4$ are same or independently selected from substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, substituted or unsubstituted $C_5$ to $C_{20}$ heteroaryl, or $B^1$ and $B^2$ form a ring; and b) p-dopants consisting of Li cation and an anion selected from perchlorate and tetrafluoroborate are excluded, and the first hole transport layer comprises a sublayer, wherein the electrical dopant is comprised in an amount, by weight and/or by volume, exceeding the total amount of other components which may additionally be comprised in the sublayer, and a method for preparing the same.

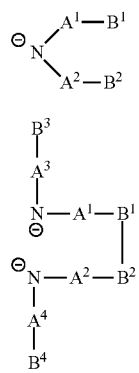

20 Claims, 4 Drawing Sheets

(51) Int. Cl.
  C07F 3/06 (2006.01)
  H01L 27/32 (2006.01)
  H01L 51/00 (2006.01)
  H01L 51/56 (2006.01)
  C07F 5/02 (2006.01)
  C09K 11/06 (2006.01)
  H01L 51/42 (2006.01)

(52) U.S. Cl.
  CPC .......... *C09K 11/06* (2013.01); *H01L 27/3211* (2013.01); *H01L 51/002* (2013.01); *H01L 51/005* (2013.01); *H01L 51/006* (2013.01); *H01L 51/008* (2013.01); *H01L 51/0054* (2013.01); *H01L 51/0061* (2013.01); *H01L 51/0071* (2013.01); *H01L 51/0072* (2013.01); *H01L 51/0077* (2013.01); *H01L 51/0084* (2013.01); *H01L 51/0092* (2013.01); *H01L 51/5092* (2013.01); *H01L 51/56* (2013.01); *C09K 2211/1018* (2013.01); *H01L 51/001* (2013.01); *H01L 51/0052* (2013.01); *H01L 51/4253* (2013.01); *H01L 51/5012* (2013.01); *H01L 51/5072* (2013.01); *H01L 51/5076* (2013.01); *H01L 51/5088* (2013.01); *H01L 51/5096* (2013.01); *H01L 2251/308* (2013.01)

(56) References Cited

U.S. PATENT DOCUMENTS

| | | |
|---|---|---|
| 8,674,047 B2 | 3/2014 | Brown et al. |
| 8,835,022 B2 | 9/2014 | Hamada et al. |
| 9,006,716 B2 | 4/2015 | Hartmann et al. |
| 9,496,509 B2 | 11/2016 | Funyuu et al. |
| 9,515,277 B2 | 12/2016 | Okabe et al. |
| 9,583,714 B2 | 2/2017 | Funyuu et al. |
| 9,853,232 B2 | 12/2017 | Shin et al. |
| 10,297,767 B2 | 5/2019 | Dorok et al. |
| 10,305,047 B2 | 5/2019 | Maltenberger et al. |
| 10,658,599 B2 | 5/2020 | Frey et al. |
| 2006/0279204 A1 | 12/2006 | Forrest et al. |
| 2009/0054232 A1 | 2/2009 | Dick et al. |
| 2012/0037907 A1 | 2/2012 | Whiting et al. |
| 2013/0330632 A1 | 12/2013 | Burschka et al. |
| 2014/0264295 A1 | 9/2014 | Sim et al. |
| 2015/0162534 A1 | 6/2015 | Maltenberger et al. |
| 2016/0284883 A1 | 9/2016 | Feng et al. |
| 2019/0330485 A1 | 10/2019 | Endo et al. |
| 2020/0020860 A1 | 1/2020 | Nakaie et al. |
| 2020/0321657 A1 | 10/2020 | Burkhardt et al. |
| 2021/0202842 A1 | 7/2021 | Fadhel et al. |

FOREIGN PATENT DOCUMENTS

| | | |
|---|---|---|
| EP | 1209708 A1 | 5/2002 |
| EP | 2693506 A1 | 5/2014 |
| EP | 3002797 A1 | 4/2016 |
| EP | 3133663 A1 | 2/2017 |
| EP | 3133664 A1 | 2/2017 |
| JP | 2001-131385 A | 5/2001 |
| JP | 2002203683 A | 7/2002 |
| JP | 4320484 B2 | 8/2009 |
| JP | 2011-228723 A | 11/2011 |
| WO | 2013/052096 A1 | 4/2013 |
| WO | 2017/014946 A1 | 1/2017 |

OTHER PUBLICATIONS

Pitula et al., "Synthesis, Structure, and Physico-Optical Properties at Manganate(II)-Based Ionic Liquids," Chem. Eur. J., 2010, 16:3355-3365.
PCT International Search Report and Written Opinion for PCT Application No. PCT/EP2018/054162 dated May 29, 2018 (9 pages).
Menke et al., "Highly Efficient p-Dopants in Amorphous Hosts," Organic Electronics, 2014, 15:365-371.
Xia et al., "Influence of Doped Anions on Poly(3,4-ethylenedioxythiophene) as Hole Conductors for Iodine-Free Solid-State Dye-Sensitized Solar Cells," J Am. Chem. Soc , 2008, 130(4):1258-1263.
PCT International Search Report and Written Opinion for PCT Application No. PCT/EP2018/053954 dated May 23, 2018 (9 pages).
Romero et al., "Highly Fluorinated Hydrotris(indazolyl)borate Calcium Complexes: The Structure and Reactivity Heavily Depend on the Ligand's Electronic Properties," Dalton Trans., 2014, 43:10114-10119.
PCT International Search Report and Written Opinion for PCT Application No. PCT/EP2018/054157 dated May 29, 2018 (11 pages).
Dong et al., "Highly Efficient Simplified Organic Light-Emitting Diodes Utilizing F4-TCNQ as an Anode Buffer Layer," Chin. Phys. Lett., 2010, 27(12):127802-1-127802-4.
PCT International Search Report and Written Opinion for PCT Application No. PCT/EP2018/054154 dated May 29, 2018 (12 pages).

(56) References Cited

OTHER PUBLICATIONS

European Office Action for EP Application No. 18706500.8 dated Jul. 22, 2021 (6 pages).
Japanese Office Action for JP Application No. 2019-544860 dated Jul. 6, 2021 (3 pages).
Taiwan Office Action for TW Application No. 1102068610 dated Jul. 20, 2021 (8 pages).
Taiwan Search Report for TW Application No. 107105849 dated Jul. 20, 2021 (1 page).
Japanese Office Action for JP Application No. 2019-544850 dated Jul. 27, 2021 (5 pages).
Chinese Office Action for CN Application No. 201880012814.3 dated Aug. 17, 2021 (21 pages, English translation).
Chinese Office Action for CN Application No. 201880012559.2 dated Aug. 25, 2021 (17 pages, English translation).
Taiwan Office Action for TW Application No. 107105623 dated Sep. 1, 2021 (5 pages).
Japanese Office Action for JP Application No. 2019-544861 dated Sep. 14, 2021 (6 pages).
Taiwan Office Action for TW Application No. 107105848 dated Sep. 3, 2021 (7 pages).
Taiwan Office Action for TW Application No. 107105850 dated Sep. 16, 2021 (8 pages)(English translaiton).
Japanese Office Action for JP Application No. 2019545368 dated Sep. 28, 2021 (8 pages)(English translation).
Chinese Office Action for CN Application No. 201880013739 dated Oct. 13, 2021.
"Notification of First Office Action" dated Nov. 1, 2021 by the China National intellectual Property Administration for CN Application No. 201880012552.0 (English translation).

ELECTRONIC SEMICONDUCTING DEVICE AND METHOD FOR PREPARING THE ELECTRONIC SEMICONDUCTING DEVICE

CROSS REFERENCE TO RELATED APPLICATIONS

This application is a U.S. national stage application of PCT/EP2018/054154, filed Feb. 20, 2018, which claims priority to European Patent Application Nos. 17156902.3, 17156904.9, and 17156906.4, which were filed Feb. 20, 2017. The content of these applications is incorporated herein by reference.

The disclosure relates to an electronic semiconducting device comprising a non-oxidizing p-dopant in a hole injection and/or hole transport layer and, to a method of preparing electronic semiconducting device.

BACKGROUND

Broad spectrum of state-of-art electronic devices which already utilize organic semiconducting materials does often set very different requirements on a particular class of materials which have to fulfill an analogous function, e.g. hole injection and/or hole transport, in seemingly similar devices. As a more specific example, the definition of materials suitable for a hole transport layer may be significantly different if the OLED shall serve e.g. as a single, unstructured OLED for illumination, or as one pixel in a complex display device comprising a plurality of OLED pixels. From a chemical point of view, it may be quite uneasy to fulfill such various requirements with materials of one structural class. This fact results in a necessity to research and develop in parallel many structurally different material classes; a commercial success is under such circumstances not only economically but also technically and scientifically challenging task. Accordingly, any material class possessing high versatility in a broad spectrum of various specific applications may become an invaluable asset.

In some cases, contradictory requirements put on the material having certain function may appear even for material comprised in one and the same device. A typical example can be an active matrix OLED display (AMOLED). In active OLED displays, comprising a plurality of OLED pixels sharing a common hole transport layer, challenging requirements are put on semiconducting materials used in layers arranged between the anode and the emitting layer and shared by the plurality of pixels. On one hand, the materials shall enable individual driving of individual pixels at operational voltages which are as low as possible. On the other hand, so called electrical crosstalk between neighbour pixels should be avoided. The application WO2016/050834 which is herein incorporated by the reference teaches that these contradictory requirements can be fulfilled by p-doped layers having electrical conductivity in the range $1 \times 10^{-3}$ $S \cdot m^{-1}$ and $1 \times 10^{-8}$ $S \cdot m^{-1}$, most favourably between $1 \times 10^{-5}$ $S \cdot m^{-1}$ and $1 \times 10^{-6}$ $S \cdot m^{-1}$. Such low-conductivity p-doped hole transport layers are achievable by use of usual state-of-art redox dopants, like strongly electron accepting radialene compounds, in matrices which are poorly dopable in terms of their deep HOMO level. There is, however, continuing demand for p-dopants fulfilling these criteria and improved in other parameters, e.g. from the view-point of processability and device stability.

SUMMARY

It is an object to provide broad variety of state-of-art electronic devices comprising electrically p-doped hole injection and/or hole transport layers, based on one broad class of p-dopants.

Another object is to provide, within the broad class of p-dopants, particular compounds having high versatility of their use in devices. The variety of devices shall include simple devices as well as improved active OLED displays. In one aspect, the performance of simple devices comprising new p-dopants shall be fully comparable with analogous simple devices comprising state-of-art p-dopants, or better. In another aspect, the new p-dopants shall overcome some drawbacks of state-of-art dopants in complex devices such as AMOLED displays. In one aspect, electrical crosstalk between neighbor pixels of the active OLED display shall be reduced. In another aspect, a high performance in simple devices as well as in individual OLED pixels of a complex display device shall be enabled. In another aspect, the improved materials should enable robust device manufacturing, e.g. in terms of improved device stability during any processing step which comprises a treatment of the device or its particular layer at an elevated temperature. The object is achieved through an electronic device comprising between a first electrode and a second electrode at least one first hole transport layer, wherein the first hole transport layer comprises (i) at least one first hole transport matrix compound consisting of covalently bound atoms and
(ii) at least one electrical p-dopant selected from metal salts and from electrically neutral metal complexes comprising a metal cation and an at least one anion and/or at least one anionic ligand consisting of at least 4 covalently bound atoms, wherein the metal cation of the electrical p-dopant is selected from
alkali metals;
alkaline earth metals, Pb, Mn, Fe, Co, Ni, Zn, Cd;
rare earth metals in oxidation state (II) or (III);
Al, Ga, In; and from
Sn, Ti, Zr, Hf, V, Nb, Ta, Cr, Mo and W in oxidation state (IV) or less;

provided that
a) p-dopants comprising anion or anionic ligand having generic formula (Ia) or (Ib)

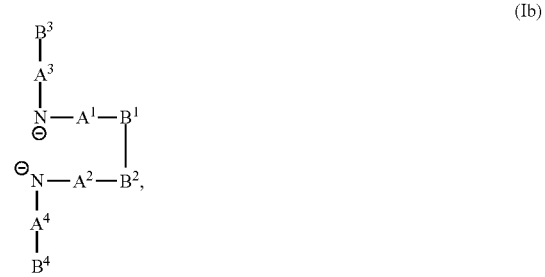

wherein
$A^1$, $A^2$, $A^3$ and $A^4$ are independently selected from CO, $SO_2$ or $POR^1$;

R¹=electron withdrawing group selected from the group comprising halide, nitrile, halogenated or perhalogenated $C_1$ to $C_{20}$ alkyl, halogenated or perhalogenated $C_6$ to $C_{20}$ aryl, or halogenated or perhalogenated heteroaryl with 5 to 20 ring-forming atoms;

$B^1$, $B^2$, $B^3$ and $B^4$ are same or independently selected from substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, substituted or unsubstituted $C_5$ to $C_{20}$ heteroaryl, or $B^1$ and $B^2$ form a ring; and b) p-dopants consisting of Li cation and an anion selected from perchlorate and tetra-fluoraborate are excluded, and the first hole transport layer comprises a sub-layer, wherein the electrical dopant is comprised in an amount, by weight and/or by volume, exceeding the total amount of other components which may additionally be comprised in the sub-layer.

In one embodiment, excluded may be p-dopants consisting of a metal cation and a carboxylate anion. In another embodiment, excluded may be p-dopants consisting of a divalent or trivalent metal cation an and an alcoholate ligand. In still another embodiment, excluded may be p-dopants consisting of a metal cation and an alcoholate ligand. In still another embodiment, lithium salt of trifluoromethane sulfonic acid may be also excluded as the p-dopant.

In one embodiment, the sub-layer comprises the p-dopant in an amount of at least 60 wt %, alternatively at least 75 wt %, alternatively at least go wt %, alternatively at least 95 wt %, alternatively at least 98 wt %, alternatively at least 99 wt %, alternatively at least 99.5 wt %, alternatively at least 99.9 wt %, with respect to the total weight of the sub-layer.

In one embodiment, the anion and/or the anionic ligand is bound to the metal cation of the p-dopant through an oxygen atom, preferably through two oxygen atoms.

It is to be understood that the term "bound" encompasses structures of the p-dopant, wherein the distance between the metal cation and the oxygen atom/atoms is shorter that the distance between the metal cation and any other atom of the anion and/or of the anionic ligand.

For example, solid-state structure studies of some bis (sulfonyl)imide complexes of divalent and/or trivalent metals revealed that the bis(sulfonyl)imide ligand may be attached to the central metal atom rather by oxygen atoms of the sulfonyl groups than by the imide nitrogen atom which may be in fact arranged more distant from the central metal atom than the oxygen atoms.

In an embodiment, the oxygen atom of the anion and/or of the anionic ligand which is in the metal salt and/or in the metal complex bound to the metal cation has in dichloroethane lower basicity than at least one non-oxygen atoms of the anion and/or of the anionic ligand.

Analogously, in another embodiment, each of the oxygen atoms of the anion and/or of the anionic ligand which are in the metal salt and/or in the metal complex bound to the metal cation has in dichloroethane lower basicity than at least one non-oxygen atom of the anion and/or of the anionic ligand.

It is to be understood that the basicity of an atom in the anion and/or in the anionic ligand in an environment, e.g. in 1,2-dichloroethane, is inversely proportional to the acidity of a corresponding tautomeric form of the electrically neutral conjugated acid formed by addition of one or more protons in the same environment. Measurement of the acidity in 1,2-dichloroethane as a versatile tool for comparison of various acids is described in Journal of Organic Chemistry (2011), 76(2), 391-395. It is understood that if the basicity of a particular atom in an anion and/or anionic ligand has to be assessed, the "corresponding tautomeric form" of the electrically neutral conjugated acid is the acid formed by proton addition to the particular atom.

In one embodiment, the anion and/or the anionic ligand consists of at least 5, preferably at least 6, more preferably at least 7, even more preferably at least 8, most preferably at least 9 covalently bound atoms.

In one embodiment, the anion and/or the anionic ligand comprises at least one atom selected from B, C, N.

In one embodiment, the anion and/or the anionic ligand comprises at least two atoms selected from B, C and N which are bound to each other by a covalent bond.

In one embodiment, the anion and/or the anionic ligand comprises at least one peripheral atom selected from H, N, O, F, Cl, Br and I. Under "peripheral atom", it is to be understood an atom which is covalently bound to only one atom of the anion and/or of the anionic ligand. Oppositely, atoms covalently bound to at least two other atoms of the anion and/or of the anionic ligand are assigned as inner atoms.

Under covalent bond, it is to be understood any bonding interaction which involves electron density sharing between the two assessed atoms, wherein the bonding is stronger than van der Waals dispersive interactions; for the sake of simplicity, binding energy to kJ/mol may be taken as an arbitrary lower limit. In this sense, the term includes also coordination bonds or hydrogen bonds. Anions and/or anionic ligands comprising hydrogen bonds, however, are not particularly preferred.

In one embodiment, the anion and/or the anionic ligand comprises at least one electron withdrawing group selected from halogenated alkyl, halogenated (hetero)aryl, halogenated (hetero)arylalkyl, halogenated alkysulfonyl, halogenated (hetero)arylsulfonyl, halogenated (hetero)arylalkylsulfonyl, cyano. It is to be understood that for the sake of brevity, halogenated (hetero)aryl means "halogenated aryl or halogenated heteroaryl", halogenated (hetero)arylalkyl means "halogenated heteroarylalkyl or halogenated arylalkyl", halogenated (hetero)arylsulfonyl means "halogenated heteroarylsulfonyl or halogenated arylsulfonyl" and halogenated (hetero)arylalkylsulfonyl means "halogenated heteroarylalkylsulfonyl or halogenated arylalkylsulfonyl".

In one embodiment, the electron withdrawing group is a perhalogenated group. It is to be understood that the term "halogenated" means that at least one hydrogen atom of a group comprising peripheral or inner hydrogen atoms is replaced with an atom selected from F, Cl, Br and I. It is further understood that in a perhalogenated group, all hydrogen atoms comprised in the unsubstituted group are replaced with atoms independently selected from F, Cl, Br and L. Accordingly, under perfluorinated group, it is to be understood a perhalogenated group, wherein all halogen atoms replacing hydrogen atoms are fluorine atoms.

In one embodiment, the metal cation of the p-dopant is selected from Li(I), Na(I), K(I), Rb(I), Cs(I); Mg(II), Ca(II), Sr(II), Ba(II), Sn(II), Pb(II), Mn(II), Fe(II), Co(II), Ni(II), Zn(II), Cd(II), Al(III); rare earth metal in oxidation state (III), V(III), Nb(III), Ta(I), Cr(III), Mo(III), W(III) Ga(III), In(III) and from Ti(IV), Zr(IV), Hf(IV), Sn(IV).

In one embodiment, in the p-dopant molecule, the atom of the anion and/or of the anionic ligand which is closest to the metal cation is a C or a N atom.

In one embodiment, the acidity of the electrically neutral conjugated acid formed from the anion and/or anionic ligand by addition of one or more protons in 1,2-dichloroethane is higher than that of HCl, preferably higher than that of HBr, more preferably higher than that of HI, even more preferably higher than that of fluorosulfuric acid, and most preferably higher than that of perchloric acid.

In one embodiment, the electrical p-dopant has energy level of its lowest unoccupied molecular orbital computed by standard quantum chemical method and expressed in absolute vacuum scale at least 0.5 eV, preferably at least 0.6 eV, more preferably at least 0.8 eV, even more preferably at least 1.0 eV, most preferably at least 1.2 eV above the energy level of the highest occupied orbital of the covalent hole transport compound computed by the standard quantum chemical method.

The standard quantum chemical method may be the software package TURBOMOLE using DFT functional B3LYP with the basis set def2-TZVP.

In one embodiment, the first hole transport matrix compound is an organic compound, preferably an organic compound comprising a conjugated system of at least 6, more preferably at least 10 delocalized electrons; also preferably, the first hole transport matrix compound comprises at least one triaryl amine structural moiety, more preferably, the first hole transport matrix compound comprises at least two triaryl amine structural moieties.

In one embodiment, all layers between the first and second electrode as well as the electrode deposited on top of the last organic layer are preparable by vacuum deposition at a pressure below $1 \times 10^{-3}$ Pa, preferably at a pressure below $5 \times 10^{-4}$ Pa, more preferably at a pressure below $1 \times 10^{-4}$ Pa.

In one embodiment, the electronic device is an organic electroluminescent device, an organic transistor, or an organic photovoltaic device.

In one embodiment, the electronic device is a display device comprising
- a plurality of OLED pixels comprising at least two OLED pixels, the OLED pixels comprising an anode, a cathode, and a stack of organic layers, wherein the stack of organic layers
    - is arranged between and in contact with the cathode and the anode, and
    - comprises a first electron transport layer, a first hole transport layer, and a first light emitting layer provided between the first hole transport layer and the first electron transport layer, and
- a driving circuit configured to separately driving the pixels of the plurality of OLED pixels, wherein, for the plurality of OLED pixels, the first hole transport layer is provided in the stack of organic layers as a common hole transport layer shared by the plurality of OLED pixels.

The object is further achieved by method for preparing the electronic device according to any of the preceding embodiments, the method comprising at least one step wherein the first hole transport matrix compound and the electrical p-dopant are in mutual contact exposed to a temperature above 50° C.

It is to be understood that "in mutual contact" does mean the presence of both components in a condensed phase, or their presence in two condensed phases which share a common phase interface.

The method may further comprise at least one step wherein the p-dopant is evaporated at a reduced pressure, preferably at a pressure below $1 \times 10^{-2}$ Pa and at a temperature above 50° C., more preferably at a pressure below $5 \times 10^{-2}$ Pa and at a temperature above 80° C., even more preferably at a pressure below $1 \times 10^{-3}$ Pa and at a temperature above 120° C., most preferably at a pressure below $1 \times 10^{-4}$ Pa and at a temperature above 150° C.

In another embodiment, the method may comprise the steps, wherein
(i) the p-dopant and the first hole transport matrix compound are dispersed in a solvent,
(ii) the dispersion is deposited on a solid support and
(iii) the solvent is evaporated at an elevated temperature.

In one embodiment, the p-dopant may be used in form of a solid hydrate.

In another embodiment, the p-dopant may be used as an anhydrous solid comprising less than 0.10 wt % water, preferably less than 0.05 wt % water.

The object is further achieved by compound having formula (I)

formula (I)

wherein M is a metal ion;
each of $A^1$-$A^4$ is independently selected from
(i) H,
(ii) F,
(iii) CN,
(iv) $C_6$-$C_{60}$ aryl,
(v) $C_7$-$C_{60}$ arylalkyl,
(vi) $C_1$-$C_{60}$ alkyl,
(vii) $C_2$-$C_{60}$ alkenyl,
(viii) $C_2$-$C_{60}$ alkynyl,
(ix) $C_3$-$C_{60}$ cycloalkyl and
(x) $C_2$-$C_{60}$ heteroaryl;
wherein, with proviso that the overall count of carbon atoms in a carbon-containing group will not exceed 60, any hydrogen atom in any carbon containing group selected from (iv), (v), (vi), (vii), (viii), (ix) and (x) may be replaced with a substituent independently selected from F, Cl, Br, I, CN, unsubstituted or halogenated alkyl, unsubstituted or halogenated (hetero)aryl, unsubstituted or halogenated (hetero)arylalkyl, unsubstituted or halogenated alkylsulfonyl, unsubstituted or halogenated (hetero)arylsulfonyl, unsubstituted or halogenated (hetero)arylalkylsulfonyl, unsubstituted or halogenated boron-containing hydrocarbyl, unsubstituted or halogenated silicon-containing hydrocarbyl;
n is valence of the metal ion; and
at least one of $A^1$-$A^4$ is F, CN, or an electron-withdrawing carbon group,
    wherein the electron-withdrawing carbon group is a carbon group selected from hydrocarbyl, boron-containing hydrocarbyl, silicon-containing hydrocarbyl and heteroaryl and having at least one half of its hydrogen atoms replaced with substituents independently selected from F, Cl, Br, I, CN.

In one embodiment, heteroaryl is selected from heteroaryls comprising a five-membered or six-membered aromatic ring comprising up to three heteroatoms selected from N, O and S.

Effect of the Invention

An important property of materials comprised in organic semi-conducting devices is their conductivity. In a display device having a structured anode and at least two pixels sharing at least one hole transport and/or hole injection layer, as described in WO2016/050834, a limited conductivity of the shared layer may be favourable for achieving a low level of the undesired electrical crosstalk in the display. On the other hand, very low conductivity of the shared layer may increase the operational voltage of the display. WO2016/050834 teaches a conductivity range which represents a trade-off between these contradictory requirements.

The authors of the present application, however, surprisingly found that electrical p-dopants based on certain metal salts and metal complexes enable, under certain conditions, preparing p-doped materials and/or p-doped layers providing stable hole injection from state-of-art anodes into state-of-art hole transport matrices, without substantially increasing the concentration of the free charge carriers above the level which corresponds to conductivities observed in a neat matrix.

This surprising finding offered an opportunity to build the displays of WO2016/050834, operating at fully comparable voltages, even though the hole transport and/or hole injection layers shared by the multiplicity of pixels have conductivities below the optimum range between $1 \times 10^{-5}$ S·m$^{-1}$ and $1 \times 10^{-6}$ S·m$^{-1}$ as disclosed in WO2016/050834. The dopants of the present application enable efficient operation of display devices of WO2016/050834 at the level of electrical conductivity in p-doped layers shared by the multiplicity of pixels which is near to the detection limit of the available measuring procedure or below it. Thus, the dopants of the present application enable further suppressing the electrical crosstalk in OLED displays and offer new opportunities for designing efficient OLED displays exhibiting very low level of electrical crosstalk. These observations made by the authors will be further described in more detail.

In a previous application EP15181385 filed by the applicant, now published as EP 3 133 663, some of the authors described successful use of some metal imides like

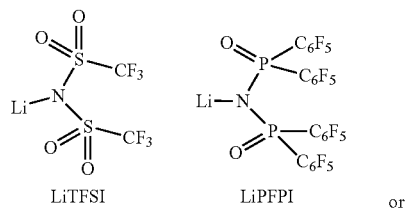

LiTFSI     LiPFPI     or

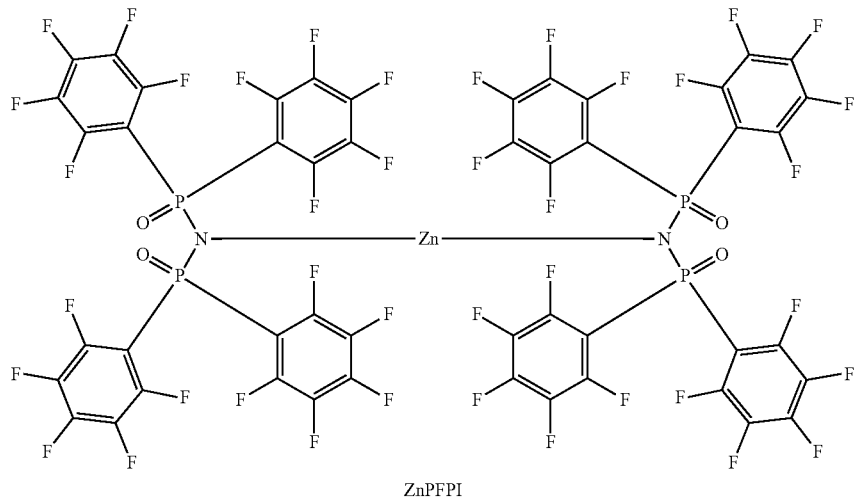

ZnPFPI as hole injection materials in organic electronic devices.

Parallel with further investigation of analogous metal imide compounds, the authors surprisingly found that also some structurally quite different compounds, namely metal borate complexes like

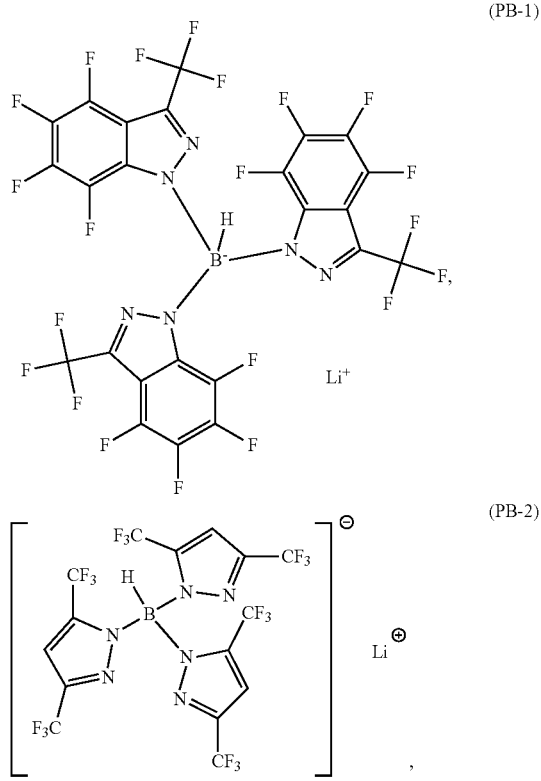

are utilizable in analogous way.

Some of the authors disclosed in a further application, namely in EP17209023, a compound E3 prepared by sublimation of a zinc sulfonamide complex, having composition $C_{42}F_{48}N_6O_{13}S_6Zn_4$ and crystallizing in a monoclinic crystal lattice belonging to the space group P 1 21 1 with unit cell dimensions a=14.1358 (5) Å, α=90°; b=16.0291 (6) Å, β=113.292 (10); c=15.9888 (6) Å; γ=90° and unit cell volume 3327.6 (2) Å³. Surprisingly, this compound has an inverse coordination complex structure shown in FIG. 5. Specifically, a molecule of the complex comprises a central oxygen dianion surrounded with a first coordination sphere which consists of four tetrahedrally arranged zinc dications, and a second coordination sphere consisting of six sulfonylamide monoanionic ligands, bridging with triatomic —N—S—O— bridges all six edges of the $Zn_4$ cluster.

Most surprisingly, the authors found that all these structurally different compounds analogously exhibit two different modes in their p-doping activity, depending on the process conditions during preparation of the doped material and/or layer.

In the first mode, semiconducting materials and/or layers doped with these compounds (which can be generalized as metal salts and/or electrically neutral metal complexes with an anionic ligand) exhibit well-measurable electrical conductivities which are only slightly lower in comparison with materials and/or layers doped with typical redox p-dopants. It appears that this mode occurs if the doped material and/or layer is exposed to oxygen, even though only in trace amounts.

In the second mode, the semiconducting materials and/or layers doped with the disclosed metal salts and/or electrically neutral metal complexes comprising an anionic ligand exhibit hardly measurable electrical conductivities. This mode occurs if the oxygen access to the doped material and/or layer is strictly avoided throughout processing thereof. The authors found that despite the extremely low conductivity of materials and/or layers doped in the second mode, devices comprising such materials and/or layers particularly as hole transporting or hole injecting layers still exhibit electrical behavior corresponding to an excellent hole injection.

The existence of the two above described modes of p-doping activity provides the disclosed p-dopants with a unique versatility in their use in organic electronic devices, and particularly in displays comprising an anode structured into a multiplicity of pixels sharing a common hole transport layer. The conductivity of the common p-doped layer can be either set in the limits taught in WO2016/050834 by exploiting the first doping mode, or set below these limits, exploiting the second doping mode.

Furthermore, recent investigations made by the authors provided hints that the materials and/or layers doped with the presented metal salts and/or metal complexes may exhibit a favourable thermal stability, particularly in materials provided according to the above described second mode of the p-doping action. These properties may be again particularly suitable for the use of the disclosed p-dopants in AMOLED displays, because the necessity of structuring such displays into separate pixels often requires a thermal treatment of p-doped layers or using another treatment which may result in an unavoidable heating of a previously deposited p-doped layer.

In a specific embodiment of the invention, the authors provided new borate compounds comprising specific heterocyclic ligands wherein at least one half of hydrogen atoms is substituted with electron withdrawing groups like halogen atoms or nitrile groups. Besides p-doping activity fully comparable with metal salts and/or anionic metal complexes of EP15181385, the borate complexes are substantially non-hygroscopic and remain solid even at high air humidity, whereas LiTFSI and analogous TFSI salts have a tendency to deliquesce.

Detailed Description

The electrical conductivity of a thin layer sample can be measured by, for example, the so called two-point method. At this, a voltage is applied to the thin layer and the current flowing through the layer is measured. The resistance, respectively the electrical conductivity, results by considering the geometry of the contacts and the thickness of the layer of the sample. The experimental setup for conductivity measurement used by the authors of the present application enables deposition of p-doped layers as well as conductivity measurement under controlled conditions, especially with regard to the contact of deposited layers with an atmosphere comprising oxygen. In this regard, the whole deposition-measurement sequence may be carried out either in a glove-box or in a chamber comprising a controlled atmosphere, using solution processing techniques, or completely in a vacuum chamber, using vacuum thermal evaporation (VTE) as the method of choice which may be especially suitable in case that materials and/or layers doped in the second mode are required.

In one embodiment, the electronic device may be an AMOLED display comprising a plurality of pixels comprising at least two pixels, wherein the first hole transport layer comprising the p-dopant is arranged between a structured anode and a structured light emitting layer. In this embodiment, the first hole transport layer is shared by the plurality of pixels, and in this case, it may be advantageous for limiting electrical crosstalk between individual pixels operated at different voltages that the electrical conductivity of the shared layer is as low as possible.

In this case, the conductivity of the first hole transport layer may be lower than $1 \times 10^{-6}$ S·m$^{-1}$, preferably lower than $1 \times 10^{-7}$ S·m$^{-1}$, more preferably lower than $1 \times 10^{-8}$ S·m$^{-1}$. Alternatively, provided that the detection limit of the used conductivity measurement method is lower than $1 \times 10^{-6}$ S·m$^{-1}$, it is preferred that in this embodiment of the electronic device, the conductivity of the first hole transport layer is lower than the detection limit.

In the AMOLED display, the cathode may be formed as a common cathode for the plurality of pixels. The common cathode may extend over all pixels of the plurality of pixels in the OLED display. Oppositely, every individual pixel may have its own anode that may not touch anodes of other individual pixels.

Optionally, for one or more of the plurality of OLED pixels, following organic layers may be provided: a hole blocking layer, an electron injection layer, and/or an electron blocking layer.

Further, the AMOLED display has driving circuit configured to separately drive the individual pixels of the plurality of pixels provided in the OLED display. In one embodiment, a step of separately driving may comprise separate control of the driving current applied the individual pixels.

The first HTL is made of a hole transport matrix (HAM) material electrically doped with the p-dopant. The hole transport matrix material may be electrically doped with more than one p-dopant. It is to be understood that the HTM material may consist of one or more HTM compounds, whereas the term hole transport material is a broader term used throughout this application for all semiconducting materials comprising at least one hole transport matrix compound. The hole transport matrix material is not particularly limited. Generally, it is any material consisting of covalently bound atoms which allows embedding the p-dopant. In this sense, infinite inorganic crystals having predominantly covalent bonds like silicon or germanium, or extremely crosslinked inorganic glasses like silicate glass, do not fall in the scope of the definition of the hole transport matrix material. Preferably, the hole transport matrix material may consist of one or more organic compounds.

In the electronic device, the first hole transport layer may have a thickness of less than 150 nm, less than too nm, less than 50 nm, less than 40 nm, less than 30 nm, less than 20 nm, or less than 15 nm.

The first hole transport layer may have a thickness of more than 3 nm, more than 5 nm, more than 8 nm, or more than 10 nm.

In one embodiment of the first hole transport layer, the p-dopant may be distributed homogeneously and isotropically. In another embodiment, the p-dopant may be homogeneously mixed with the matrix but the concentration of the p-dopant may exhibit a gradient across the layer. The present invention encompasses any embodiment, wherein the first hole transport layer may comprise a sub-layer, wherein the amount of the p-dopant may, by weight and/or by volume, exceed the total amount of other components which may additionally be comprised in the layer.

In one embodiment, the weight concentration of the p-dopant, based on the overall weight of the sub-layer, may exceed 50%; alternatively, the p-dopant may form at least 75 wt %, alternatively at least 90 wt %, alternatively at least 95 wt %, alternatively at least 98 wt %, alternatively at least 99 wt %, alternatively at least 99.5 wt %, alternatively at least 99.9 wt %, with respect to the total weight of the sub-layer. For the sake of simplicity, any sub-layer of the first transport layer prepared by depositing only the p-dopant may be assigned as a neat p-dopant sub-layer, for example as a neat hole injection sub-layer.

The same may apply for any other layer in the display device which may comprise a combination of a hole transport matrix with a metal salt and/or metal complex brought into mutual contact with each other, analogously as in the first hole transport layer.

For example, pixels comprised in the display device may comprise a hole generation layer, which may, in one embodiment, consist of a hole transport matrix homogeneously doped with the p-dopant. In another embodiment, the hole generation layer may comprise a sub-layer, wherein the amount of the p-dopant exceeds, by weight and/or by volume, the total amount of other components.

The anode may be made of a transparent conductive oxide (TCO), like indium tin oxide (ITO) or aluminium zinc oxide (AZO). Alternatively, the anode may be made of one or more thin metallic layers leading to a semitransparent anode. In another embodiment, the anode may be made of a thick metallic layer which is not transparent to visible light.

The electronic device may comprise an electron blocking layer (EBL) provided between the first hole transport layer and the light emitting layer. The EBL may be in direct contact with the first HTL and the EML. The electron blocking layer may be an electrically undoped layer (in other words, it may be free of an electrical dopant) made of an organic hole transport matrix material. The composition of the organic hole transport matrix material of the first hole transport layer may be the same as the composition of the organic hole transport matrix material of the electron blocking layer. In another embodiment of the invention, the composition of both hole transport matrix materials may be different.

The EBL may have a layer thickness of more than 300 nm, more than 50 nm, more than 70 nm, more than 100 nm, or more than 11 nm.

The thickness of the EBL may be less than 200 nm, less than 170 nm, less than 140 nm, or less than 130 nm. Compared to the EBL, the common HTL may be thinner by about one order of magnitude.

Each compound forming the electron blocking layer may have a highest occupied molecular orbital (HOMO) energy level, expressed in the absolute scale referring to vacuum energy level being zero, higher than a HOMO level of any compound forming the hole transport matrix material of the common hole transport layer.

The organic matrix material of the electron blocking layer may have a hole mobility which is equal to or higher than the hole mobility of the matrix material of the hole transport layer.

The hole transport matrix (HTM) material of the common HTL and/or of the EBL may be selected from compounds comprising a conjugated system of delocalized electrons, the conjugated system comprising lone electron pairs of at least two tertiary amine nitrogen atoms.

Suitable compounds for the hole transport matrix material of the doped hole transport layer and/or the common hole transport layer may be selected from the known hole transport matrices (HTMs), e.g. from triaryl amine compounds. HTMs for the doped hole transport material may be compounds comprising a conjugated system of delocalized electrons, wherein the conjugated system comprises lone electron pairs of at least two tertiary amine nitrogen atoms. Examples are N4,N4'-di(naphthalen-1-yl)-N4,N4'-diphenyl-[1,1'-biphenyl]-4,4'-diamine (HT1), and N4,N4,N4'',N4''-tetra([1,1'-biphenyl]-4-yl)-[1,1':4',1''-terphenyl]-4,4''-diamine (HT4). The synthesis of terphenyldiamine HTMs is described e.g. in WO 2011/134458 A1, US 2012/223296 A1 or WO 2013/135237 A1; 1,3-phenylenediamine matrices are described e.g. in WO 2014/060526 A. These documents are herein incorporated by reference. Many triaryl amine HTMs are commercially available.

The electronic device may further comprise a light absorbing layer arranged between the first and second electrode, e.g. in a solar cell. In another embodiment, the electronic device may be an electroluminescent device, comprising between the first and second electrode at least one light emitting layer.

The light emitting layer of the electroluminescent device may be continuous, or structured. Example of an electroluminescent device which comprises a structured light emitting layer may be the AMOLED display which may comprise a plurality of sub-regions, each of the sub-regions being assigned to one of the pixels from the plurality of pixels. The light emitting layer of an individual pixel, corresponding to a sub-region of the emitting layer of the display, preferably does not touch light emitting layers of neighbor pixels. In the display manufacturing process, the organic layer comprising EMLs of individual pixels may be patterned by known methods, for example, by fine-metal masking (FMM), laser induced thermal imaging (LITI), and/or ink-jet printing (IJP) in either top emission, bottom emission or bottom emission micro cavity (see, for example, Chung et al. (2006), 70.1: Invited Paper: Large-Sized Full Color AMOLED TV: Advancements and Issues. SID Symposium Digest of Technical Papers, 37: 1958-1963. doi: 10.1889/1.2451418; Lee et al. (2009), 53.4: Development of 31-Inch Full-HD AMOLED TV Using LTPS-TFT and RGB FMM. SID Symposium Digest of Technical Papers, 40: 802-804. doi: 0.1889/1.3256911). A RGB layout may be provided.

For the plurality of OLED pixels, a common electron transport layer may be formed by the electron transport layers provided in the stack of organic layers of the plurality of OLED pixels.

The electron transport layer of the electronic device may comprise an organic electron transport matrix (ETM) material. Further, the electron transport layer may comprise one or more n-dopants. Suitable compounds for the ETM are not particularly limited. In one embodiment, the electron transport matrix compounds consist of covalently bound atoms. Preferably, the electron transport matrix compound comprises a conjugated system of at least 6, more preferably of at least to delocalized electrons. In one embodiment, the conjugated system of delocalized electrons may be comprised in aromatic or heteroaromatic structural moieties, as disclosed e.g. in documents EP 1 970 371 A1 or WO 2013/079217 A1.

The cathode can be made of a metal or a metal alloy with a low work function. Transparent cathodes made of a TCO are also well-known in the art.

The stack of organic layers may be made of organic compounds having a molecular weight of less than 2000 g/mol. In an alternative embodiment, the organic compounds may have a molecular weight of less than 1000 g/mol.

DESCRIPTION OF DRAWINGS

In the following, further embodiments will be described in further detail, by way of example, with reference to figures. In the figures show.

DESCRIPTION OF EMBODIMENTS

Figure 1:
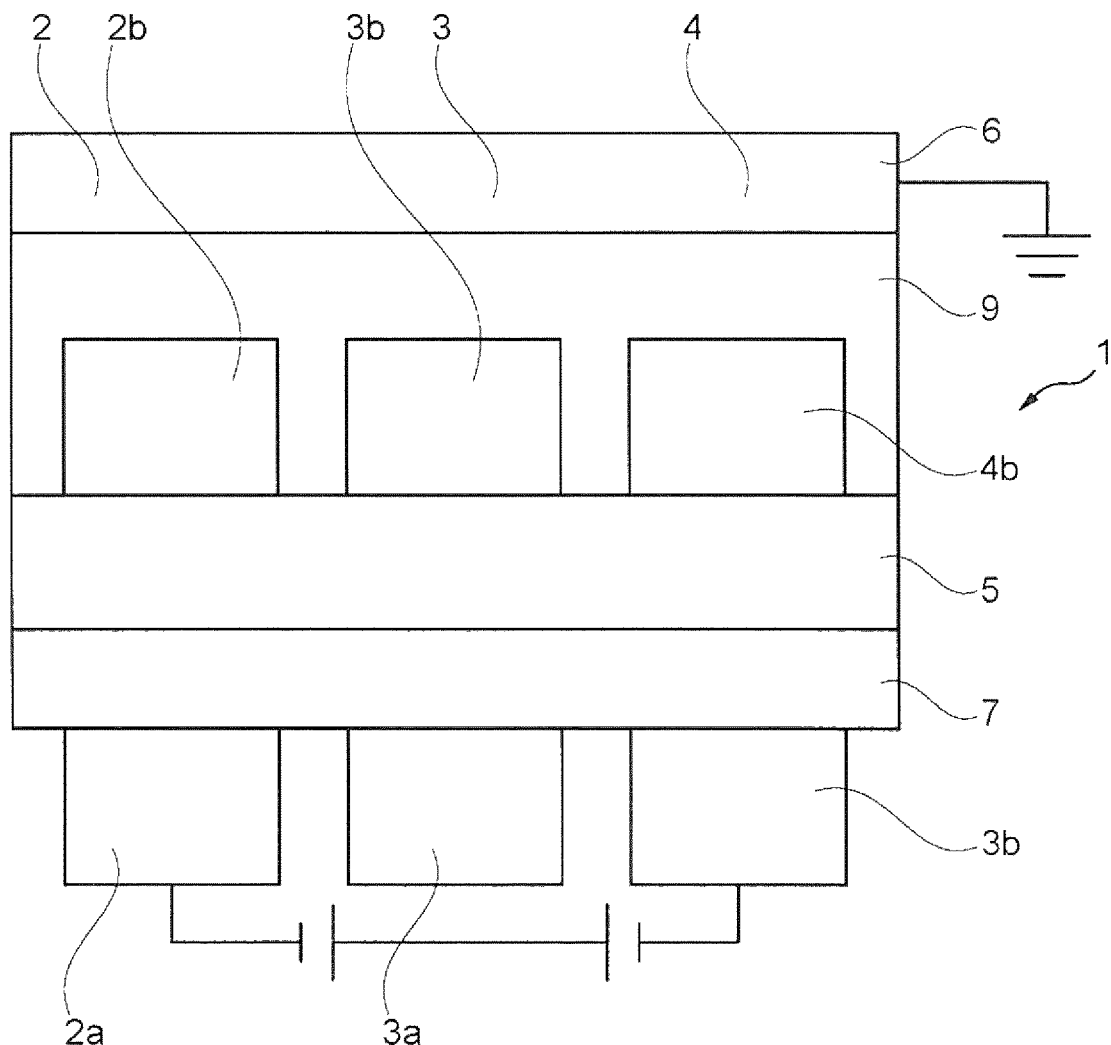
FIG. 1 a schematic representation of an active OLED display, the display having a plurality of OLED pixels.

FIG. 1 shows a schematic representation of an active OLED display 1 having a plurality of OLED pixels 2, 3, 4 provided in an OLED display 1.

In the OLED display 1, each pixel 2, 3, 4 is provided with an anode 2a, 3a, 4a being connected to a driving circuit (not shown). Various equipment able to serve as a driving circuit for an active matrix display is known in the art. In one embodiment, the anodes 2a, 3a, 4a are made of a TCO, for example of ITO.

A cathode 6 is provided on top of an organic stack comprising an electrically doped hole transport layer (HTL) 7, an electron blocking layer (EBL) 5, a light emitting layer (EML) having sub-regions 2b, 3b, 4b assigned to the pixels 2, 3, 4 and being provided separately in an electron transport layer (ETL) 9. For example, the sub-regions 2b, 3b, 4b can provide an RGB combination for a color display (R—red, G—green, B—blue). In another embodiment, pixels for individual colours may comprise analogous white OLEDs provided with appropriate combination of colour filters. By applying individual drive currents to the pixels 2, 3, 4 via the anodes 2a, 3a, 4a and the cathode 6, the display pixels 2, 3, 4 are operated independently.

Figure 2:
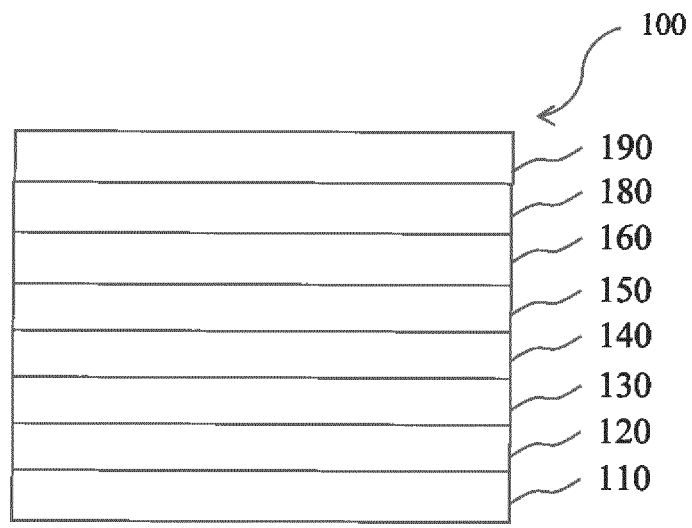
FIG. 2 is a schematic sectional view of an organic light-emitting diode (OLED), according to an exemplary embodiment of the present invention.

FIG. 2 is a schematic sectional view of an organic light-emitting diode (OLED) 100, according to an exemplary embodiment of the present invention. The OLED 100 includes a substrate 110, an anode 120, a hole injection layer (HIL) 130, a hole transport layer (HTL) 140, an emission layer (EML) 150, an electron transport layer (ETL) 160. The electron transport layer (ETL) 160 is formed directly on the EML 150. Onto the electron transport layer (ETL) 160, an electron injection layer (EIL) 180 is disposed. The cathode 190 is disposed directly onto the electron injection layer (EIL) 180.

Instead of a single electron transport layer 160, optionally an electron transport layer stack (ETL) can be used.

Figure 3:
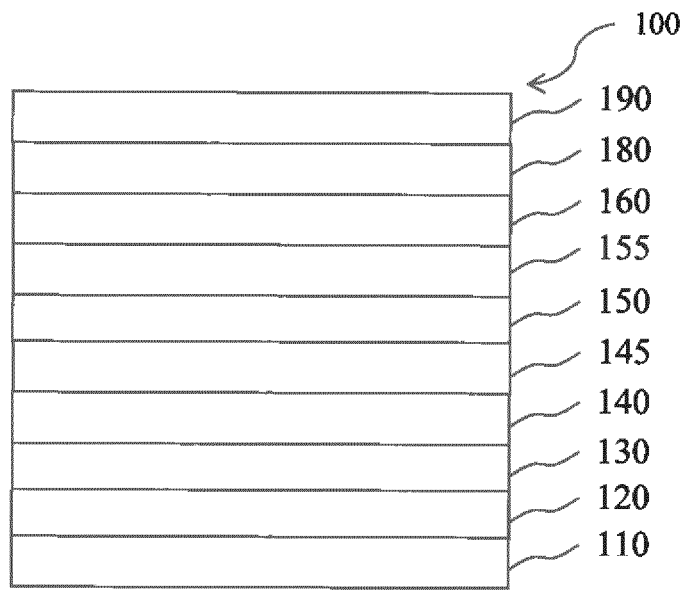
FIG. 3 is a schematic sectional view of an OLED, according to an exemplary embodiment of the present invention.

FIG. 3 is a schematic sectional view of an OLED 100, according to another exemplary embodiment of the present invention. 3 differs from FIG. 2 in that the OLED 100 of FIG. 3 comprises an electron blocking layer (EBL) 145 and a hole blocking layer (HBL) 155.

Referring to FIG. 3, the OLED 100 includes a substrate 110, an anode 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode electrode 190.

Figure 4:
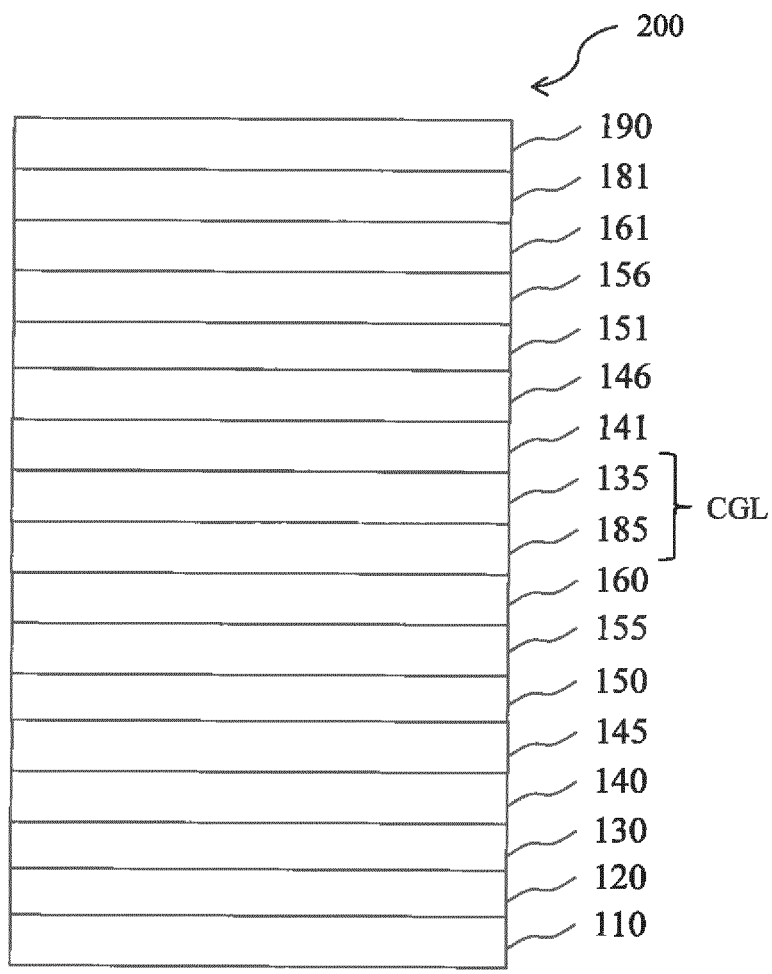
FIG. 4 is a schematic sectional view of a tandem OLED comprising a charge generation layer, according to an exemplary embodiment of the present invention.
Figure 5:
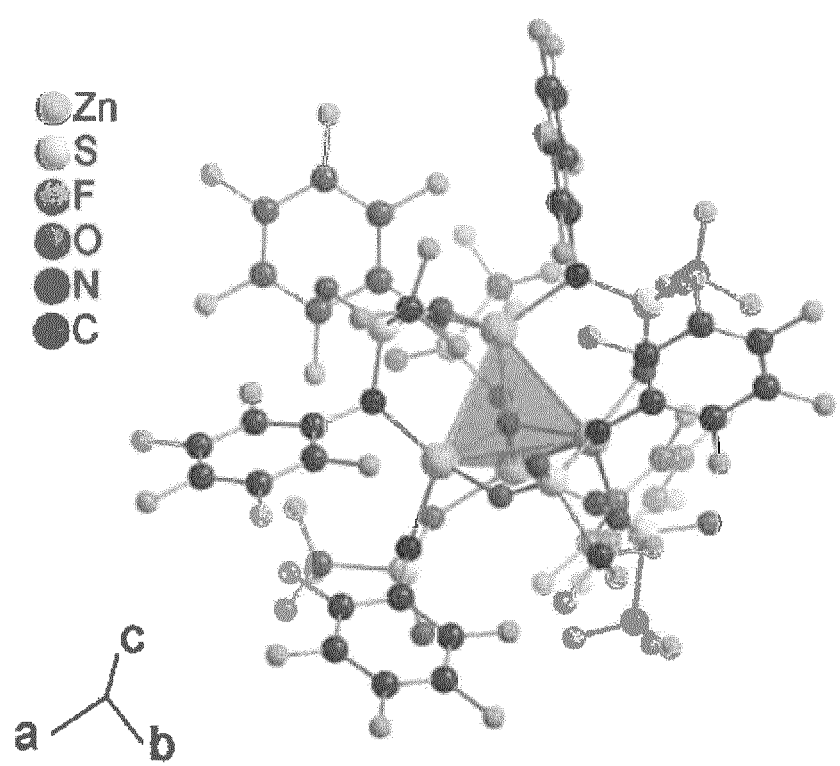
FIG. 5 shows the crystal structure of the inverse coordination complex E3, having the summary formula $C_{42}F_{48}N_5O_{13}S_6Zn_4$.

FIG. 4 is a schematic sectional view of a tandem OLED 200, according to another exemplary embodiment of the present invention. FIG. 4 differs from FIG. 3 in that the OLED 100 of FIG. 3 further comprises a charge generation layer and a second emission layer.

Referring to FIG. 4, the OLED 200 includes a substrate no, an anode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 16*o*, an n-type charge generation layer (n-type CGL) 185, a hole generating layer (p-type charge generation layer; p-type GCL) 135, a second hole transport layer (HTL) 141, a second electron blocking layer (EBL) 146, a second emission layer (EML) 151, a second hole blocking layer (EBL) 156, a second electron transport layer (ETL) 161, a second electron injection layer (EIL) 181 and a cathode 190.

While not shown in FIG. 2, FIG. 3 and FIG. 4, a sealing layer may further be formed on the cathode electrodes 190, in order to seal the OLEDs 100 and 200. In addition, various other modifications may be applied thereto.

SYNTHESES EXAMPLES lithium tris(4,5,6,7-tetrafluoro)-3-(trifluoromethyl-1H-indazol-1-yl)hydroborate Step 1: 4,5,6,7-tetrafluoro-3-(trifluoromethyl)-1H-indazole

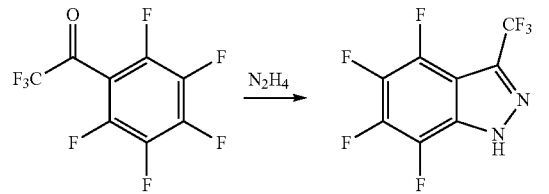

Chemical Formula: $C_8F_8O$
Molecular Weight: 264.07

Chemical Formula: $C_8HF_7N_2$
Molecular Weight: 258.10

11.09 g (45.1 mmol) perfluoroacetophenone are dissolved in 100 mL toluene. The solution is cooled with an ice bath and 2.3 mL (2.37 g, 47.3 mmol, 1.05 eq) hydrazine-monohydrate is added dropwise. The mixture is heated to reflux for 3 days. After cooling to room temperature, the mixture is washed two times with 100 mL saturated aqueous sodium hydrogen carbonate solution and two times with 100 mL water, dried over magnesium sulfate and the solvent is removed under reduced pressure. The yellow, oily residue is distilled from bulb to bulb at a temperature about 140° C. and pressure about 12 Pa. The crude product is dissolved in hot hexane and the solution stored at −18° C. The precipitated solid is filtered off and the slurry washed two times in 10 mL hexane. 5.0 g (43%) product is obtained as a slightly yellow solid.

GCMS: confirms the expected M/z (mass/charge) ratio 258

Step 2: lithium tris(4,5,6,7-tetrafluoro-3-(trifluoromethyl)-1H-indazol-1-yl)hydroborate

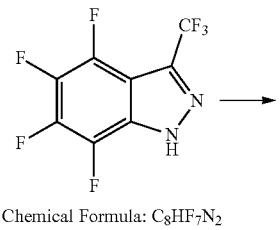

Chemical Formula: $C_8HF_7N_2$
Molecular Weight: 258.10

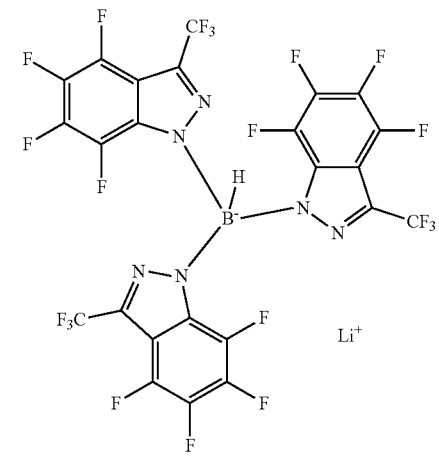

Chemical Formula: $C_{24}HBF_{21}LiN_6$
Molecular Weight: 790.03

5.1 g (19.8 mmol) 4,5,6,7-tetrafluoro-3-(trifluoromethyl)-1H-indazole is added under Ar counter-flow to an out-baked Schlenk flask and treated with 3 mL toluene. Freshly pulverized lithium borohydride is added to the starting material. The mixture is heated to 101° C., until hydrogen formation ceases (ca. 4 h). After slight cooling, 15 mL hexane are added, the mixture is heated to reflux for to min and cooled to room temperature. The precipitated solid is filtered off, washed with 10 mL hot hexane and dried in high vacuum. 2.55 g (49%) product are obtained as an off-white solid.

lithium tris(3,5-bis(trifluoromethyl)-1H-pyrazol-1-yl)hydroborate (PB-2)

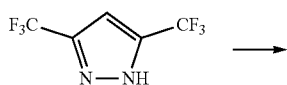

Chemical Formula: $C_5H_2F_6N_2$
Molecular Weight: 204.08

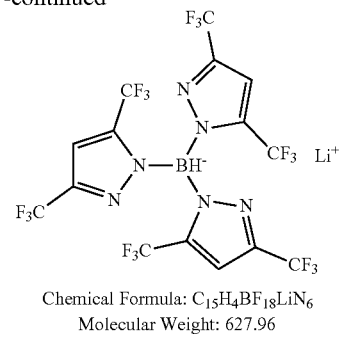

Chemical Formula: $C_{15}H_4BF_{18}LiN_6$
Molecular Weight: 627.96

2.0 g (9.8 mmol, 5 eq) 3,5-bis(trifluoromethyl)pyrazole in a baked-out Schlenk flask is dissolved in 5 mL dry toluene. 43 mg (1.96 mmol, 1 eq) freshly pulverized lithium borohydride is added under Ar counter-flow and the mixture is heated to reflux for 3 days. The solvent and excess starting material are removed by distillation under reduced pressure and the residue is crystallized from n-chlorohexane. 0.25 g (20%) product is obtained as a white solid.

lithium tris(4,5,6,7-tetrafluoro-3-(perfluorophenyl)-1H-indazol-1-yl)hydroborate (PB-3)

Step 1: 4,5,6,7-tetrafluoro-3-(perfluorophenyl)-1H-indazole

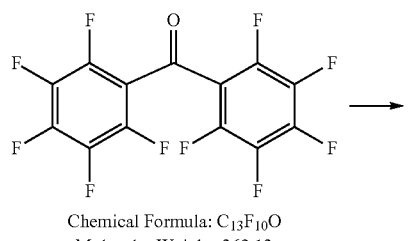

Chemical Formula: $C_{13}F_{10}O$
Molecular Weight: 362.13

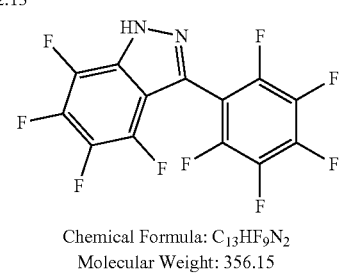

Chemical Formula: $C_{13}HF_9N_2$
Molecular Weight: 356.15

20.0 g (54.8 mmol) perfluorobenzophenone are dissolved in 200 mL toluene. 4.0 mL (4.11 g, 82.1 mmol, ca. 1.5 eq) hydrazine-monohydrate is added dropwise to the ice-cooled solution. 40 g sodium sulfate are added and the mixture is heated to reflux for 2 days. After cooling, 10 mL acetone are added to the reaction mixture and the resulting slurry is stirred for 1 h at room temperature. The solid is filtered off, thoroughly washed with 4×50 mL toluene, organic fractions are combined and washed two times with saturated aqueous sodium hydrogen carbonate. The solvent is removed under reduced pressure and the residue purified by column chromatography. 7.92 g (41%) product are obtained as a pale yellow solid.

GC-MS: confirms the expected M/z (mass/charge) ratio 356

Step 2: lithium tris(4,5,6,7-tetrafluoro-3-(perfluorophenyl)-1-indazol-1-yl)hydroborate

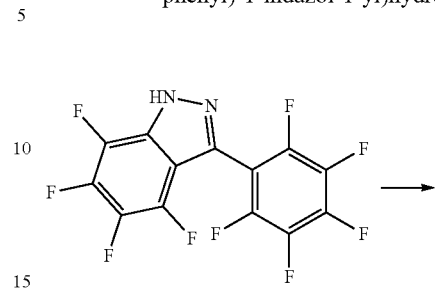

Chemical Formula: $C_{13}HF_9N_2$
Molecular Weight: 356.15

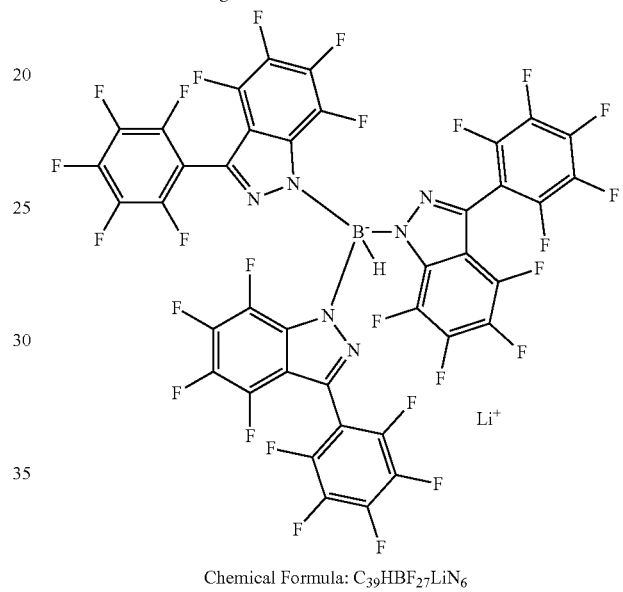

Chemical Formula: $C_{39}HBF_{27}LiN_6$
Molecular Weight: 1084.19

1.02 g (2.86 mmol, 3.0 eq) 4,5,6,7-tetrafluoro-3-(perfluorophenyl)-1H-indazole are dissolved in 5 mL chlorobenzene in a baked-out Schlenk flask. Freshly pulverized lithium borohydride (21 mg, 0.95 mmol, 1.0 eq) is added under Ar counter-flow. The mixture is heated to 150° C. for 2 days and cooled to room temperature. The solvent is removed under reduced pressure and the residue dried in high vacuum. The crude is further purified by drying in a bulb to bulb apparatus at a temperature about 150° C. and a pressure about 12 Pa. 0.57 g (70%) product are obtained as an off white solid.

Lithium tris(3-cyano-5,6-difluoro-1H-indazol-1-yl)hydroborate (PB-4)

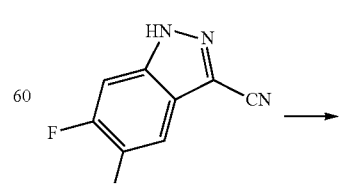

Chemical Formula: $C_{13}HF_9N_2$
Molecular Weight: 356.15

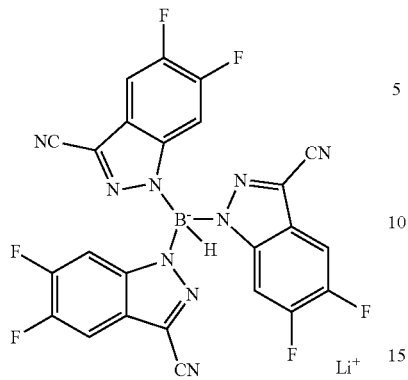

Chemical Formula: $C_{24}H_7BF_6LiN_9$
Molecular Weight: 553.12

Freshly pulverized lithium borohydride (15 mg, 0.7 mmol, 1.0 eq) is placed in a baked-out pressure tube, 0.5 g (2.79 mmol, 4.0 eq) 5,6-difluoro-1H-indazole-3-carbonitrile are added under Ar counter-flow and washed down with 1 mL toluene. The pressure tube is closed and heated to a temperature about 160° C. for ca 21 h. After cooling to room temperature, the mixture is treated with 5 mL hexane in an ultra-sonic bath for ca 30 min. The precipitated solid is filtered off and washed with hexane (20 mL in total). After drying, 0.48 g yellowish solid are obtained.

zinc(II) tris(3,5-bis(trifluoromethyl)-1H-pyrazol-1-yl)hydroborate (PB-5)

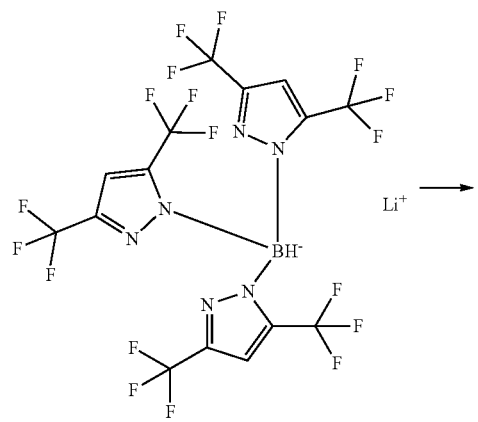

Chemical Formula: $C_{16}H_4BF_{18}LiN_6$
Molecular Weight: 627.96

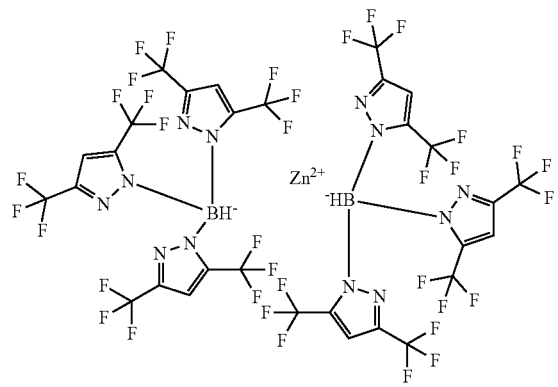

Chemical Formula: $C_{30}H_8B_2F_{36}N_{12}Zn$
Molecular Weight: 1307.42

0.57 g (0.91 mmol) lithium tris(3,5-bis(trifluoromethyl)-1H-pyrazol-1-yl)hydroborate are dissolved in 6 mL N,N-dimethyl formamide. An aqueous solution of 62 mg zinc dichloride in 1 mL water is added dropwise. 20 mL water are further added and the mixture is treated in an ultra-sonic bath for 2 h. The precipitate is filtered off and dried in high vacuum. 0.485 g (82%) product are obtained as a white solid.

Exemplary Compound E3

A Precursor Compound E2 has been Prepared According to Scheme 1

Scheme 1: Synthesis of bis((1,1,1-trifluoro-N-(perfluorophenyl)methyl)-sulfonamido)zinc

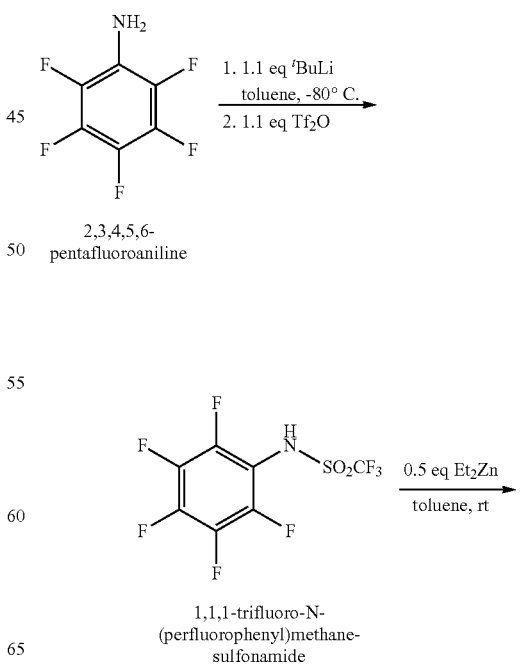

2,3,4,5,6-pentafluoroaniline 1,1,1-trifluoro-N-(perfluorophenyl)methane-sulfonamide -continued

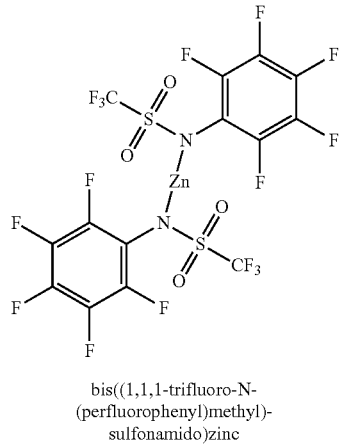

bis((1,1,1-trifluoro-N-
(perfluorophenyl)methyl)-
sulfonamido)zinc

Step 1: Synthesis of 1,1,1-trifluoro-N-(perfluorophenyl)methanesulfonamide

A 250 mL Schlenk flask is heated in vacuum and, after cooling, purged with nitrogen. Per-fluoroaniline is dissolved in 100 mL toluene and the solution cooled to −80° C. A 1.7 M t-butyl lithium solution in hexane is added dropwise via syringe over 10 min. The reaction solution changes from clear to cloudy and is stirred for 1 h at −80° C. After that, the solution is allowed to warm to −60° C. and 1.1 eq of trifluoromethanesulfonic anhydride is added dropwise to the solution. Then, the cooling bath is removed and the reaction mixture is allowed to warm slowly to ambient temperature and stirred overnight, whereby the color changes to light orange. Additionally, a white solid forms. The precipitated by-product lithium trifluoromethane sulfonate is filtered off by suction filtration over a sintered glass filter and washed with 2×30 mL toluene and 30 mL n-hexane. The orange filtrate is evaporated and dried in high vacuum, forming crystals. The crude product is then purified by bulb-to-bulb distillation (135° C. @ 1.2×10−1 mbar), resulting in a crystalline colorless solid (main fraction).

$^1$H NMR [$d^6$-DMSO, ppm] δ: 13.09 (s, 1H, N—H).

$^{13}$C{$^1$H} NMR [$d^6$-DMSO, ppm] δ: 116.75 (m, $C_i$-$C_6F_5$), 120.74 (q, $^1J_{CF}$=325 Hz, $CF_3$), 136.39, 138.35 (2 m, $^2J_{CF}$=247 Hz, m-$C_6F_5$), 137.08, 139.06 (2 m, $^2J_{CF}$=247 Hz, p-$C_6F_5$), 142.98, 144.93 (2 m, $^2J_{CF}$=247, Hz o-$C_6F_5$).

$^{19}$F NMR [$d^6$-DMSO, ppm]δ: −77.45 (m, $CF_3$), −148.12 (m, $C_6F_5$), −160.79 (n, p-$C_6F_5$), −164.51 (m, $C_6F_5$).

ESI-MS: m/z-neg=314 (M-H).

EI-MS: m/z=315 (M), 182 (M-$SO_2CF_3$), 69 ($CF_3$).

Step 2: Synthesis of bis((1,1,1-trifluoro-N-(perfluorophenyl)methyl)-sulfonamido)zinc A 100 mL Schlenk flask is heated in vacuum and, after cooling, purged with nitrogen. 1,1,1-trifluoro-N-(perfluorophenyl) methane sulfonamide is dissolved in to mL toluene and 0.5 eq of diethyl zinc in hexane is added dropwise to the solution via syringe at ambient temperature. During the addition, a fog forms in the flask and the reaction solution becomes jelly and cloudy. The solution is stirred for further 30 min at this temperature. After that, 30 mL n-hexane are added and a white precipitate forms, which is subsequently filtered over a sintered glass filter (pore 4) under inert atmosphere. The filter cake is twice washed with 15 mL n-hexane and dried in high vacuum at 100° C. for a h.

Yield: 660 mg (0.95 mmol, 60% based on 1,1,1-trifluoro-N-perfluorophenyl) methane sulfonamide) as a white solid.

$^{13}$C{$^1$H} NMR [$d^6$-DMSO, ppm] δ: 121.68 (q, $^1J_{CF}$=328 Hz, $CF_3$), 123.56 (m, $C_i$-$C_6F_5$), 133.98, 135.91 (2 m, $^2J_{CF}$=243 Hz, p-$C_6F_5$), 136.15, 138.13 (2 m, $^2J_{CF}$=249 Hz, m-$C_6F_5$), 142.33, 144.24 (2 m, $^2J_{CF}$=240, Hz o-$C_6F_5$).

$^{19}$F NMR [$d^6$-DMSO, ppm] δ: −77.52 (m, $CF_3$), −150.43 (m, $C_6F_5$), −166.77 (m, $C_6F_5$), −168.23 (m, p-$C_6F_5$).

ESI-MS: m/z-neg=314 (M-Zn-L).

EI-MS: m/z=692 (M), 559 (M-$SO_2CF_3$) 315 ($C_6F_5NHSO_2CF_3$), 182 ($C_6F_5NH$), 69 ($CF_3$).

Exemplary Compound E3

9.1 g E2 is sublimed at the temperature 240° C. and pressure $30^{-3}$ Pa.

yield 5.9 g (65%).

The sublimed material forms colorless crystals. One crystal of an appropriate shape and size (0.094×0.052×0.043 mm$^3$) has been closed under Ar atmosphere in a glass capillary and analyzed on Kappa Apex II diffractometer (Bruker-AXS, Karlsruhe, Germany) with mono-chromatic X-ray radiation from a source provided with molybdenum cathode (λ=71.073 pm). Overall 37362 reflexions were collected within the theta range 1.881 to 28.306. The structure was resolved by direct method (SHELXS-97, Sheldriek, 2008) and refined with a full-matrix least-squares method (SHELXL-2014/7, Olex2 (Dolomanov, 2017).

ТABLE 1
auxiliary materials for device examples
| Compound | Structure |
|---|---|
| F$_1$ (CAS 1242056-42-3) | 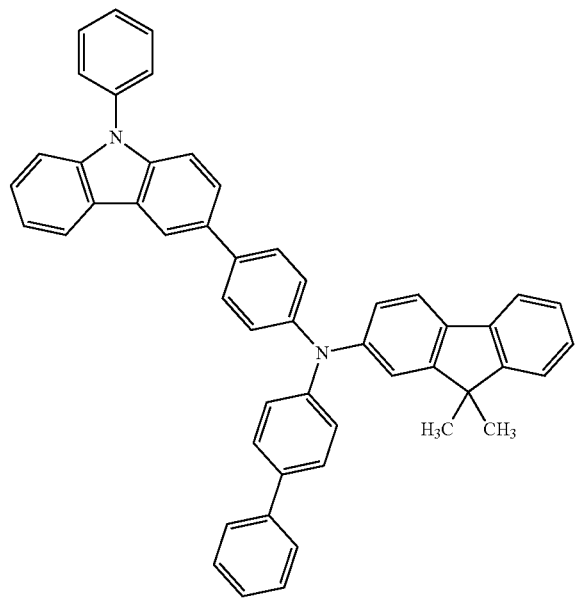 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] |
| F$_2$ (CAS 1440545-225-1) | 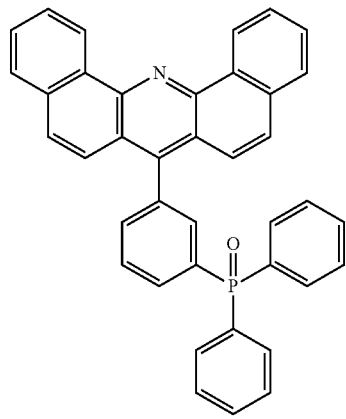 [SMILES: O=P(c1ccccc1)(c1ccccc1)c1cccc(-c2c3ccc4ccccc4c3nc3c2ccc2ccccc23)c1] |
| F$_3$ (CAS 597578-38-6) | 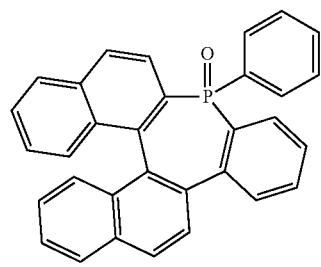 [SMILES: O=P1(c2ccccc2)c2ccccc2-c2ccc3ccccc3c2-c2c1ccc1ccccc21] |

TABLE 1-continued
auxiliary materials for device examples
| Compound | Structure |
|---|---|
| F$_4$ (CAS 1207671-22-4) | 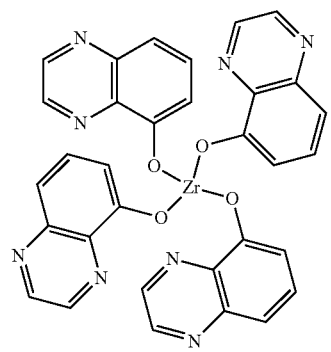 |
| F$_5$ CAS 1638271-85-8 | 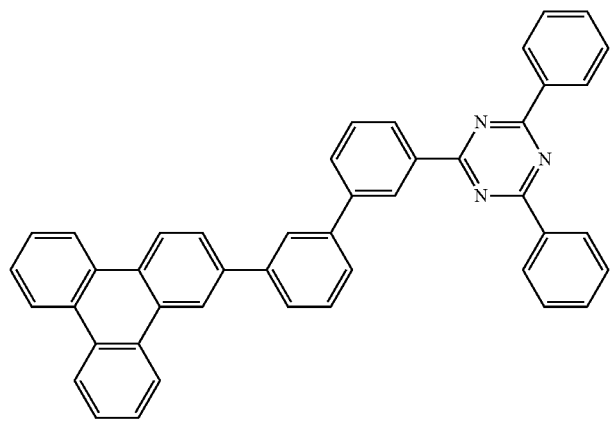 [SMILES: c1ccc(-c2nc(-c3ccccc3)nc(-c3cccc(-c4cccc(-c5ccc6c7ccccc7c7ccccc7c6c5)c4)c3)n2)cc1] |
| F6 CAS 721969-94-4 | 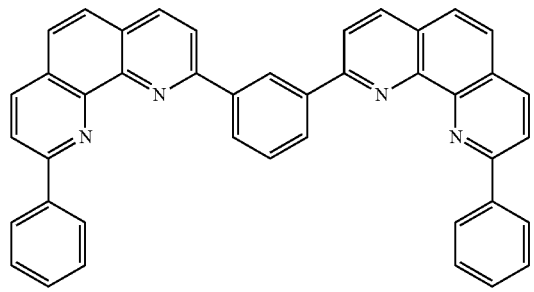 [SMILES: c1ccc(-c2ccc3ccc4ccc(-c5cccc(-c6ccc7ccc8ccc(-c9ccccc9)nc8c7n6)c5)nc4c3n2)cc1] |
| PD$_2$ 2,2',2''-(cyclopropane-1,2,3-triylidene)-tris[2-(4-cyanoperfluorophenyl)-acetonitrile] (CAS1224447-88-4) | 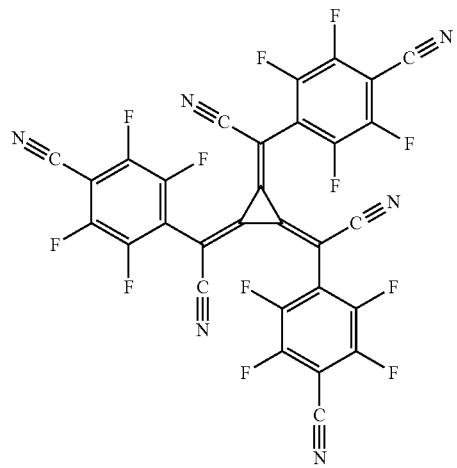 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F] |

TABLE 1-continued auxiliary materials for device examples

| Compound | Structure |
| --- | --- |
| LiQ<br>8-Hydroxyquinolato lithium<br>(CAS 850918-68-2) | |
| CN-HAT<br>(CAS 105598-27-4) | |

ABH-113 is an emitter host and NUBD-370 and DB-200 are blue fluorescent emitter dopants, all commercially available from SFC, Korea.

Before use in vacuum deposition processes, the auxiliary materials as well as the tested compounds were purified by preparative vacuum sublimation.

DEVICE EXAMPLES

Example 1 (Bottom Emitting White OLED Pixel, Comprising a Metal Complex or Metal Salt as a p-Dopant Concentrated in a Neat Hole Generating Sub-Layer)

On a glass substrate provided with an ITO anode having thickness go nm, there were subsequently deposited ho nm hole injection layer made of F1 doped with 8 wt % PD-2; 140 nm thick undoped hole transport layer made of neat F1; 20 nm thick first emitting layer formed of ABH113 doped with 3 wt % BD200 (both supplied by SFC, Korea); 25 nm thick first electron transport layer made of neat F2; 10 nm thick electron-generating part of the charge-generating layer (n-CGL) made of F3 doped with 5 wt % Yb; 2 nm thick interlayer made of F4; 30 nm thick hole-generating part of the charge-generating layer (p-CGL) made of PB-1; 10 nm thick second hole transport layer made of neat F; 20 nm second emitting layer of the same thickness and composition as the first emitting layer; 25 nm thick first electron transport layer made of neat F2; 10 nm thick electron injection layer (EIL) made of F3 doped with 5 wt % Yb; too nm Al cathode.

All layers were deposited by vacuum thermal evaporation (VTE).

At the current density 10 mA/cm$^2$, the operational voltage of the device 8 V and the observed luminance were well comparable with the same device comprising a commercial state-of-art p-dopant instead of PB-1. An accurate calibration necessary for efficiency evaluation was omitted within this preliminary experiment.

Example 2 (Bottom Emitting Blue OLED Pixel Comprising a Metal Complex or Metal Salt as a p-Dopant Concentrated in a Neat Hole Injecting Sub-Layer)

On the same glass substrate provided with an ITO anode as in the Example 1, following layers were subsequently deposited by VTE: 10 nm hole injection layer made of the compound PB-1; 120 nm thick HTL made of neat F1; 20 nm EML made of ABH113 doped with 3 wt % NUBD370 (both supplied by SFC, Korea), 36 nm EIL/ETL made of F2 doped with 50 wt % LiQ; 100 nm Al cathode.

Comparative device comprised the HIL made of the compound CN-HAT (CAS 105598-27-4) instead of PB-1.

The inventive device achieved current density 15 mA/cm and EQE 5.4% at a voltage 5.2 V, whereas the comparative device operated at 5.4 V with EQE 4.9%.

Example 3 (Blue Display Pixel Comprising a Metal Complex or a Metal Salt as a p-Dopant Concentrated in a Neat Hole Injection Sub-Layer)

Table 2a schematically describes the model device

TABLE 2a

| Material | c<br>[wt %] | d<br>[nm] |
| --- | --- | --- |
| ITO | 100 | 90 |
| p-dopant | 100 | 3* |
| F$_1$ | 100 | 120 |
| ABH$_{113}$:NUBD$_{370}$ | 97:3 | 20 |
| F$_2$:LiQ | 50:50 | 36 |
| Al | 100 | 100 |

*E$_3$ has been tested also as a layer only 1 nm thin.

The results for LiTFSI as a reference and one exemplary p-dopant are given in Table 2b TABLE 2b

|  | U* [V] | EQE* [%] | CIE-y* | U(50 h)-U(1 h) ** [V] |
|---|---|---|---|---|
| 3 nm LiTFSI | 5.28 | 6.6 | 0.090 | 0.275 |
| 3 nm $E_3$ | 5.38 | 5.7 | 0.094 | 0.246 |
| 1 nm $E_3$ | 5.11 | 5.4 | 0.096 | 0.040 |

*j = 15 mA/cm$^2$
** j = 30 mA/cm$^2$

Example 4 (Blue Display Pixel Comprising a Metal Complex or a Metal Salt as a p-Dopant Concentrated in a Neat Hole Generation Sub-Layer)

Table 3a schematically describes the model device.

TABLE 3a

| Material | c [wt %] | d [nm] |
|---|---|---|
| ITO | 100 | 90 |
| $F_1$:PD-2 | 92:8 | 10 |
| $F_1$ | 100 | 145 |
| $ABH_{113}$:$BD_{200}$ | 97:3 | 20 |
| $F_5$ | 100 | 25 |
| $F_6$:Li | 99:1 | 10 |
| ZnPc | 100 | 2 |
| p-dopant | 100 | 1 |
| $F_1$ | 100 | 30 |
| $ABH_{113}$:$BD_{200}$ | 97:3 | 20 |
| $F_5$ | 100 | 26 |
| F6:Li | 99:1 | 10 |
| Al | 100 | 100 |

The results for LiTFSI as a reference and one exemplary p-dopant are given in Table 3b TABLE 3b

|  | U* [V] | EQE* [%] | CIE-y* |
|---|---|---|---|
| 1 nm LiTFSI | 10.65 | 6.3 | 0.066 |
| 1 nm $E_3$ | 7.52 | 13.5 | 0.083 |

*j = 10 mA/cm$^2$
**j = 30 mA/cm$^2$

The features disclosed in the foregoing description and in the dependent claims may, both separately and in any combination thereof, be material for realizing the aspects of the disclosure made in the independent claims, in diverse forms thereof.

Key symbols and abbreviations used throughout the application:
CV cyclic voltammetry
DSC differential scanning calorimetry
EBL electron blocking layer
EIL electron injecting layer
EML emitting layer
eq. equivalent
ETL electron transport layer
ETM electron transport matrix
Fc ferrocene
Fc$^+$ ferricenium
HBL hole blocking layer
HIL hole injecting layer
HOMO highest occupied molecular orbital
HPLC high performance liquid chromatography
HTL hole transport layer
p-HTL p-doped hole transport layer
HTM hole transport matrix
ITO indium tin oxide
LUMO lowest unoccupied molecular orbital
mol % molar percent
NMR nuclear magnetic resonance
OLED organic light emitting diode
OPV organic photovoltaics
QE quantum efficiency
$R_f$ retardation factor in TLC
RGB red-green-blue
TCO transparent conductive oxide
TFr thin film transistor
$T_g$ glass transition temperature
TLC thin layer chromatography
wt % weight percent

The invention claimed is:

1. Electronic device comprising, between a first electrode and a second electrode, at least one first hole transport layer, wherein the first hole transport layer comprises
   (i) at least one first hole transport matrix compound consisting of covalently bound atoms and
   (ii) at least one electrical p-dopant selected from metal salts and from electrically neutral metal complexes comprising a metal cation and a at least one anion and/or at least one anionic ligand consisting of at least 4 covalently bound atoms,
wherein the metal cation of the electrical p-dopant is selected from
   alkali metals;
   alkaline earth metals, Pb, Mn, Fe, Co, Ni, Zn, Cd;
   rare earth metals in oxidation state (II) or (III);
   Al, Ga, In; and from
   Sn, Ti, Zr, Hf, V, Nb, Ta, Cr, Mo and W in oxidation state (IV) or less;
provided that
a) the at least one electrical p-dopant comprises an anion or anionic ligand having generic formula (Ia) or (Ib)

$$\overset{\ominus}{N}\underset{A^2-B^2}{\overset{A^1-B^1}{\diagup}} \quad (Ia)$$

$$\begin{array}{c} B^3 \\ | \\ A^3 \\ | \\ \overset{\ominus}{N}-A^1-B^1 \\ | \\ \overset{\ominus}{N}-A^2-B^2, \\ | \\ A^4 \\ | \\ B^4 \end{array} \quad (Ib)$$

wherein
$A^1$, $A^2$, $A^3$ and $A^4$ are independently selected from CO, $SO_2$ or $POR^1$;
$R^1$=electron withdrawing group selected from the group comprising halide, nitrile, halogenated or perhalogenated $C_1$ to $C_{20}$ alkyl, halogenated or perhalogenated $C_6$ to $C_{20}$ aryl, or halogenated or perhalogenated heteroaryl with 5 to 20 ring-forming atoms;
$B^1$, $B^2$, $B^3$ and $B^4$ are same or independently selected from substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, substituted or unsubstituted $C_5$ to $C_{20}$ heteroaryl, or $B^1$ and $B^2$ form a ring; and b) p-dopants consisting of Li cation and an anion selected from perchlorate and tetrafluoroborate are excluded from the at least one electrical p-dopant, and the first hole transport layer comprises a sub-layer, wherein the at least one electrical dopant is comprised in an amount, by weight and/or by volume, exceeding the total amount of other components which may additionally be comprised in the sub-layer.

2. Electronic device according to claim 1, wherein the sub-layer comprises the at least one electrical p-dopant in an amount of at least 60 wt % with respect to the total weight of the sub-layer.

3. Electronic device according to claim 1, wherein the anion and/or anionic ligand consists of at least 5 covalently bound atoms.

4. Electronic device according to claim 1, wherein the anion and/or anionic ligand comprises at least one atom selected from B, C, N.

5. Electronic device according to claim 1, wherein the anion and/or anionic ligand comprises at least two atoms selected from B, C and N which are bound to each other by a covalent bond.

6. Electronic device according to claim 1, wherein the anion and/or anionic ligand comprises at least one peripheral atom selected from H, N, O, F, Cl, Br and I.

7. Electronic device according to claim 1, wherein the anion and/or anionic ligand comprises at least one electron withdrawing group selected from halogenated alkyl, halogenated (hetero)aryl, halogenated (hetero)arylalkyl, halogenated alkylsulfonyl, halogenated (hetero)arylsulfonyl, halogenated (hetero)arylalkylsulfonyl, cyano.

8. Electronic device according to claim 7, wherein the electron withdrawing group is a perhalogenated group.

9. Electronic device according to claim 8, wherein the perhalogenated electron withdrawing group is a perfluorinated group.

10. Electronic device according to claim 1, wherein the metal cation of the at least one electrical p-dopant is selected from Li(I), Na(I), K(I), Rb(I), Cs(I); Mg(II), Ca(II), Sr(II), Ba(II), Sn(II), Pb(II), Mn(II), Fe(II), Co(II), Ni(II), Zn(II), Cd(II), Al(III); rare earth metal in oxidation state (III), V(III), Nb(III), Ta(III), Cr(III), Mo(III), W(III) Ga(III), In(III) and from Ti(IV), Zr(IV), Hf(IV) Sn(IV).

11. Electronic device according to claim 1, wherein in the p-dopant molecule, the atom of the anion and/or of the anionic ligand which is closest to the metal cation is a C or a N atom.

12. Electronic device according to claim 1, wherein the acidity of the electrically neutral conjugated acid formed from the anion and/or anionic ligand by addition of one or more protons in 1,2-dichloroethane is higher than that of HCl.

13. Electronic device according to claim 1, wherein the electrical p-dopant has energy level of its lowest unoccupied molecular orbital computed by standard quantum chemical method and expressed in absolute vacuum scale at least 0.5 eV above the energy level of the highest occupied orbital of the covalent hole transport compound computed by the standard quantum chemical method, wherein the standard quantum chemical method uses the software package TURBOMOLE using DFT functional B3LYP with the basis set def2-TZVP.

14. Electronic device according to claim 1, wherein the first hole transport matrix compound is an organic compound.

15. Electronic device according to claim 1, which is an organic electroluminescent device, an organic transistor, or an organic photovoltaic device.

16. Electronic device according to claim 1, wherein all layers between the first and second electrode as well as the electrode deposited on top of the last organic layer are preparable by vacuum deposition at a pressure below $1 \times 10^{-3}$ Pa.

17. Method for preparation of the electronic device of claim 1, the method comprising at least one step wherein the covalent hole transport matrix compound and the at least one electrical p-dopant are in mutual contact exposed to a temperature above 50° C.

18. Method according to claim 17, further comprising a step, wherein the at least one electrical p-dopant is evaporated at a reduced pressure.

19. Electronic device according to claim 1, wherein the sub-layer comprises the at least one electrical p-dopant in an amount of at least 75 wt %.

20. Electronic device according to claim 1, wherein the sub-layer comprises the at least one electrical p-dopant in an amount of at least 98 wt %.

* * * * *

UNITED STATES PATENT AND TRADEMARK OFFICE
CERTIFICATE OF CORRECTION

PATENT NO. : 11,239,440 B2
APPLICATION NO. : 16/485808
DATED : February 1, 2022
INVENTOR(S) : Ulrich Heggemann et al.

It is certified that error appears in the above-identified patent and that said Letters Patent is hereby corrected as shown below:

In the Claims

Column 30, Line 38, replace "comprises" with --comprising--.

Column 31, Line 9, replace "dopant" with --p-dopant--.

Signed and Sealed this
Fourteenth Day of June, 2022

Katherine Kelly Vidal
*Director of the United States Patent and Trademark Office*